United States Patent

Huang et al.

[11] Patent Number: 5,961,912
[45] Date of Patent: Oct. 5, 1999

[54] ENCAPSULATING METHOD OF SUBSTRATE BASED ELECTRONIC DEVICE

[75] Inventors: Chien Ping Huang, Hsingchu; Kevin Yu, Changhua; Chih Ming Huang, Taichung, all of Taiwan

[73] Assignee: Siliconware Precision Industries Co., LTD., Taichung, Taiwan

[21] Appl. No.: 08/986,934

[22] Filed: Dec. 8, 1997

[30] Foreign Application Priority Data

Sep. 18, 1997 [TW] Taiwan ................................. 86113569

[51] Int. Cl.⁶ ............................ B29C 70/70; B29C 45/02
[52] U.S. Cl. ............................. 264/272.15; 264/272.17; 264/276; 264/328.4
[58] Field of Search ......................... 264/272.11, 272.14, 264/272.15, 272.17, 275, 276, 278, 254, 264, 328.5; 425/116, 544

[56] References Cited

U.S. PATENT DOCUMENTS

| H1654 | 6/1997 | Rounds | 264/272.17 |
|---|---|---|---|
| 5,098,626 | 3/1992 | Pas | 264/328.5 |
| 5,151,276 | 9/1992 | Sato et al. | 264/272.17 |
| 5,542,171 | 8/1996 | Juskey et al. | 264/276 |
| 5,543,159 | 8/1996 | Iltgen | 264/219 |
| 5,635,671 | 6/1997 | Freyman et al. | 174/52.2 |
| 5,744,084 | 4/1998 | Chia et al. | 264/276 |
| 5,779,958 | 7/1998 | Nishihara et al. | 264/276 |

*Primary Examiner*—Angela Ortiz
*Attorney, Agent, or Firm*—Bacon & Thomas PLLC.

[57] ABSTRACT

An encapsulating method of a substrate-based electronic device of the present invention comprises:

the substrate-based electronic device to be encapsulated is placed in the cavity of an encapsulating mold, then an encapsulant is put in a pot of the encapsulating mold, and said encapsulating mold is closed;

said encapsulant in the pot is liquidized by heating, and let the liquidized encapsulant go in the cavity through a runner and a gate, and then fill in a semiconductor die;

after the encapsulant filled in said semiconductor die is substantially solidified, said encapsulating mold is opened and an encapsulated substrate-based electronic device is taken out from said cavity;

which is characterized by that, before encapsulant injection, a degate shim is pre-placed on the substrate of said substrate-based electronic device locating at the position where the runner passes through, in order to let this degate shim substantially makes said encapsulant have no contact with said substrate during injection of encapsulant.

3 Claims, 3 Drawing Sheets

ENCAPSULATING METHOD OF SUBSTRATE BASED ELECTRONIC DEVICE

FIELD OF THE INVENTION

The present invention comprises an encapsulating method for a substrate-based electronic device, especially related to an encapsulating method in which the encapsulant and the substrate of the electronic device substantially have no contact during injection of the encapsulant.

BACKGROUND OF THE INVENTION

In the usually used encapsulating method for a substrate-based electronic device, during removal, the encapsulant sticks on the runner and the gate on the substrate, substrate and package are often damaged. In severe cases, damage reaches even to the encapsulated electronic device, resulting in reduction in the pass rate of encapsulating. FIGS. 1 and 2 show the relative location of encapsulating mold, encapsulant, and substrate-based electronic device in conventional encapsulating method, wherein FIG. 1 is a vertical cross sectional view, and FIG. 2 is a cross sectional sketch along the A—A direction in FIG. 1. In the figures, number 100 is an encapsulating mold, 110, 120, 130, 140 and 150 are its upper mold, lower mold, a cavity, a pot and a runner, respectively, 131 is a transfer ram on up side of the pot; 200 is an encapsulant; 300 is a substrate-based electronic device; 310 and 320 are its gate and substrate, respectively. When the encapsulant 200 in the pot 140 is liquidized, then filled in the cavity 130 through the runner 150/the gate 310, and directly covers on the substrate 320, said substrate 320, package and/or electronic device are often damaged during degating.

It is the constant effort of the mold/encapsulating maker to resolve the above defect of ordinary encapsulating method. The U.S. Pat. No. 5,635,671 offers one solution, which consists of pre-designing a degating region on the substrate. The degating region is plated with metal (gold or palladium)layer, so that adhesion force between encapsulant and degating region becomes far smaller than that between encapsulant and substrate to overcome the defect of ordinary encapsulating method, that is the substrate, the package and/or the electronic device are damaged during degating the runner and the gate on the substrate. Nevertheless, the gold or palladium plating process in this method will raise the cost of the substrate, and also add a requirement for one more quality control/guarantee step. Furthermore, in degating step of said manufacturing processes, because of the use of the high sticky encapsulant produces a phenomenon of peeling gold plating layer occurs. This is equal to the defect of the ordinary encapsulating method can not be completely removed by this method. Besides, U.S. Pat. No. 5,635,671 has another quality problem as follows. FIG. 3 is a drawing of its substrate-based electronic device, and FIG. 4 shows the relative position of its encapsulating mold/substrate-based electronic device along the direction the B—B in FIG. 3, in which definitions of 110, 150, 310, 320 and 330 are the same as before, 321 is solder resist on the substrate 320, 321a and 321b are solder resists 321 on edge area of the degating region respectively, 331, 332 and 333 are gold plating layer and copper plating layer on the degating region 330 and base material (such as bismaleimide trisazine resin) on the degating region 330, respectively. As coefficients of thermal expansion of copper/gold layer and B.T. resin are different, after the encapsulant is solidified, temperature decreases (from liquefaction temperature, e.g. 175° C. down to room temperature) can produce warpage of the substrate, which will introduce unsatisfactory coplanarity of solder ball, after successive process of solder ball placement. This will then result in the quality problem on bad contact of SMT. Besides, in injecting encapsulant, the phenomenon that molded flash may remain on the gold plating layer of a product after press molding due to the smaller width of the runner/gate than that of the plating degating region. This will effect quality of the product. As edge areas 321a and 321b of solder resist and encapsulant of the runner are close together, breakdown of solder resist edge areas 321a and 321b may happen, during degate process. This also will effect quality and reliability of the product.

SUMMARY OF THE INVENTION

The inventors have engaged in semiconductor encapsulating business for many years, and desired to overcome the defect of ordinary encapsulating method. After long term study, they have found that by letting encapsulant and substrate substantially make no contact during encapsulant injection, damage on substrate, package and/or electronic device can be completely avoided during degating, so that the purpose of removing the defect produced by ordinary encapsulating method can be reached. By this way, the invention is accomplished. As the invention does not require pre-designing a metal degating region, the defect of the above U.S. Pat. No. 5,635,671 can be avoided.

An object of the present invention is to provide an encapsulating method in which the encapsulant substantially has no contact with substrate.

Another object of the present invention is to provide an encapsulating method in which a degate shim is preset on the degating region.

DETAILED DESCRIPTION OF THE INVENTION

Figure 1:
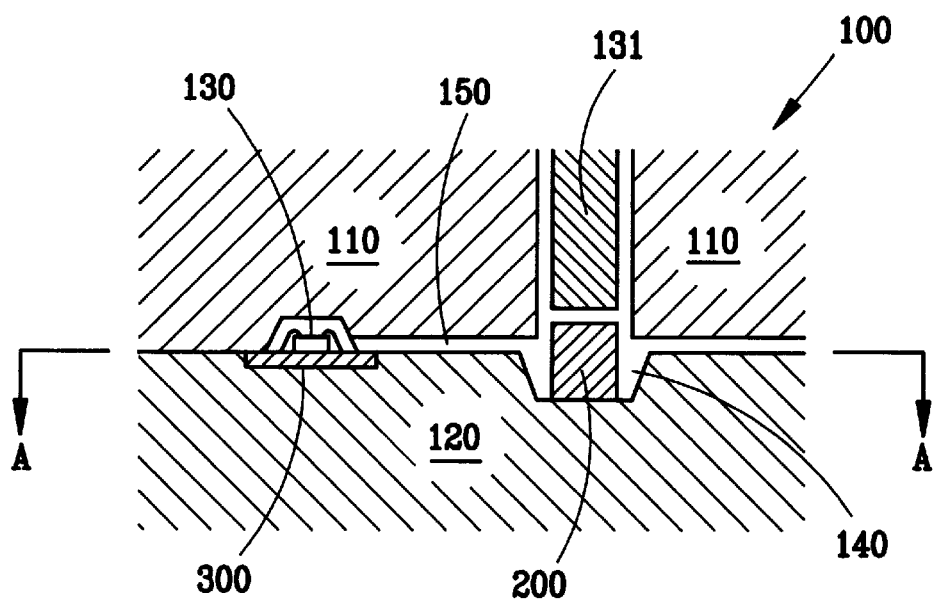
FIG. 1 and FIG. 2 shows molds used in an ordinary encapsulating method.
Figure 2:
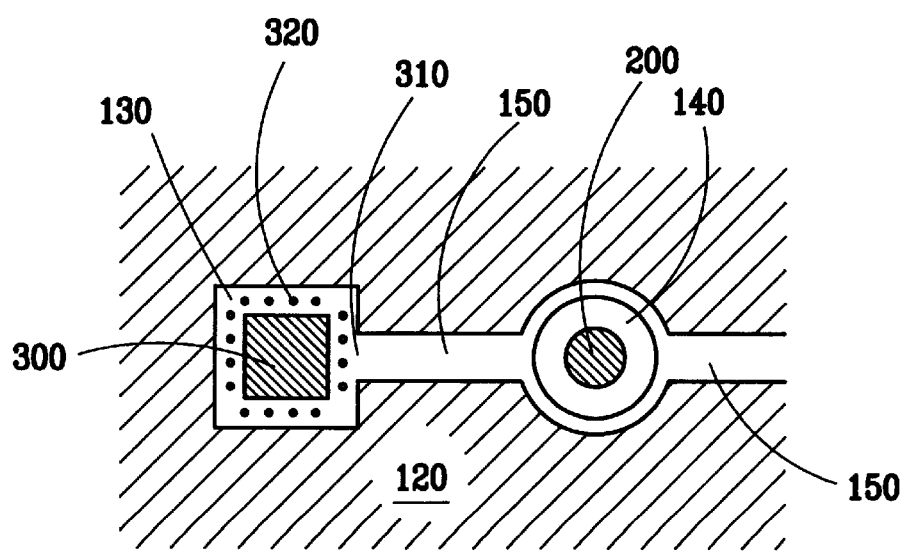
Figure 3:
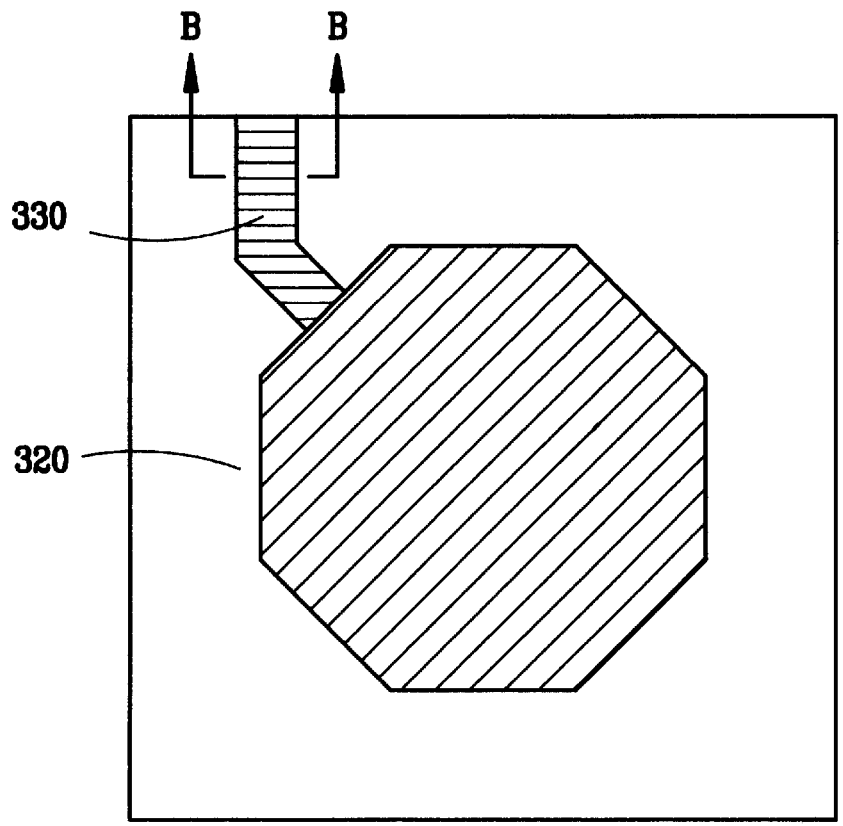
FIG. 3 and FIG. 4 shows molds used in the encapsulating method of the U.S. Pat. No. 5,635,671.
Figure 4:
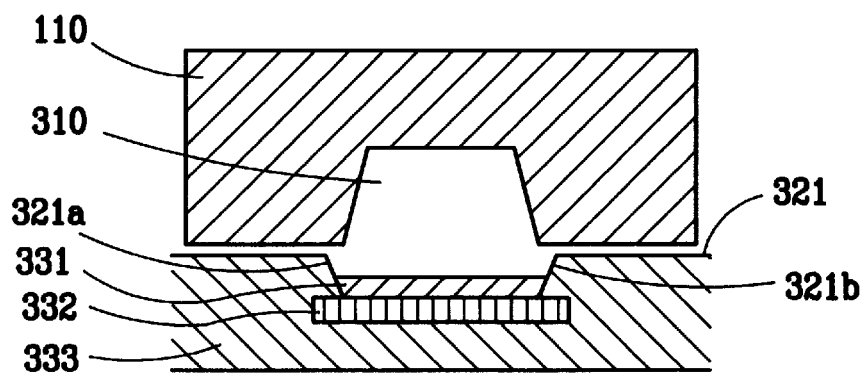

An encapsulating method of a substrate-based electronic device of the present invention comprises:

the substrate-based electronic device to be encapsulated is placed in the cavity of an encapsulating mold, then an encapsulant is put in a pot of the encapsulating mold, and said encapsulating mold is closed;

said encapsulant in the pot is liquidized by heating, and the liquidized encapsulant flows into the cavity through a runner and a gate, and then fills in a semiconductor die;

after the encapsulant filled-in said semiconductor die is substantially solidified, said encapsulating mold is opened and the encapsulated substrate-based electronic device is taken out from said cavity;

which is characterized in that, before encapsulant injection, a degate shim is pre-placed on the substrate of said substrate-based electronic device located at the position where the runner passes through, in order to let this degate shim substantially prevents the encapsulant from having any contact with said substrate during injection of the encapsulant.

As the above mentioned encapsulating mold, an ordinary encapsulating mold can be employed, and it has similar structure of gate, pot and runner to that of an ordinary encapsulating mold.

The above mentioned steps of placing the encapsulant in the pot of said mold and closing the encapsulating mold, is not essential. For example, the encapsulant can be placed in the pot of the mold first, and then said encapsulating mold is closed; or, said encapsulating mold can be closed first, and then the encapsulant can be placed in the pot of the mold through a reserved hole.

The above mentioned substrate-based electronic device means the electronic device that is placed on a substrate, wherein said electronic device for example, may be an integrated circuit chips. The semiconductor die of said substrate-based electronic device has a gate, through which encapsulant is filled in the semiconductor die during encapsulant injection.

As the above mentioned encapsulant, any well-known encapsulant may be employed.

The above mentioned method of: placing a substrate-based electronic device in the cavity of an encapsulating mold, placing encapsulant in a pot of the encapsulating mold, closing the encapsulating mold, liquidizing encapsulant, and letting the encapsulant go into a gate through a runner to fill in the semiconductor die of said substrate-based electronic device, is similar to ordinary encapsulating method. But,the present invention preset a degate shim on the so-called degating region, before injecting the encapsulant. By this way, said encapsulant substantially will not comes into contact with said substrate during encapsulant injection. As said encapsulant is substantially not in contact with said substrate, during degate process, waste material on the gate can be easily peeled off from the molded product, without causing any damage on said substrate, package and/or electronic device.

For said degate shim mentioned above, any material that will not warp during encapsulant injecting process, i.e. that can resist working temperature of encapsulating mold (about 175° C.), such as piece shaped polymer, for example polyimide piece; piece shaped alloy, for example Alloy 42, Alloy 194; metal piece, for example copper piece, aluminum piece; paper piece or heat resisting plastic tape, etc. can be used.

The expression "preset" mentioned above means to place said degate shim (such as said polyimide piece, alloy piece, metal piece or paper piece) beforehand on said degating region, or to stick said degate shim (such as said paper piece or heat-resisting plastic tape) beforehand on said degating region. Of course, ordinary method of setting a groove beforehand on degating region to put in said preset degate shim can be employed. But, presetting of a groove may induce a defect on successive part (For example, manufacturing process becomes complicated.), so that it is better not to preset a groove.

To avoid poor close-fitting of encapsulating mold or flash when injecting encapsulant, the thickness of said degate shim is better not to exceed about 0.05 mm, and it is further better not to exceed 0.01 mm. The present inventors used self-sticking paper of about 0.04 mm (The product of 3M, article name: Post-it), and pre-sticking it on ordinary so-called degating region. By following encapsulating process, it is surely certified that the object of the present invention has been reached. Another trial of employing about 0.01 mm thickness metal piece as the degate shim was practiced, and obtained better result in proceeding encapsulant injection. If ordinary method of pre-setting a groove on degating region is practiced, then it is better to limit the thickness of said degate shim not exceed the depth of said groove by about 0.05 mm. It is much better if it does not exceed the depth of said groove by to about 0.01 mm. In principle, its width should be wider than that of a runner/gate.

Figure 5:
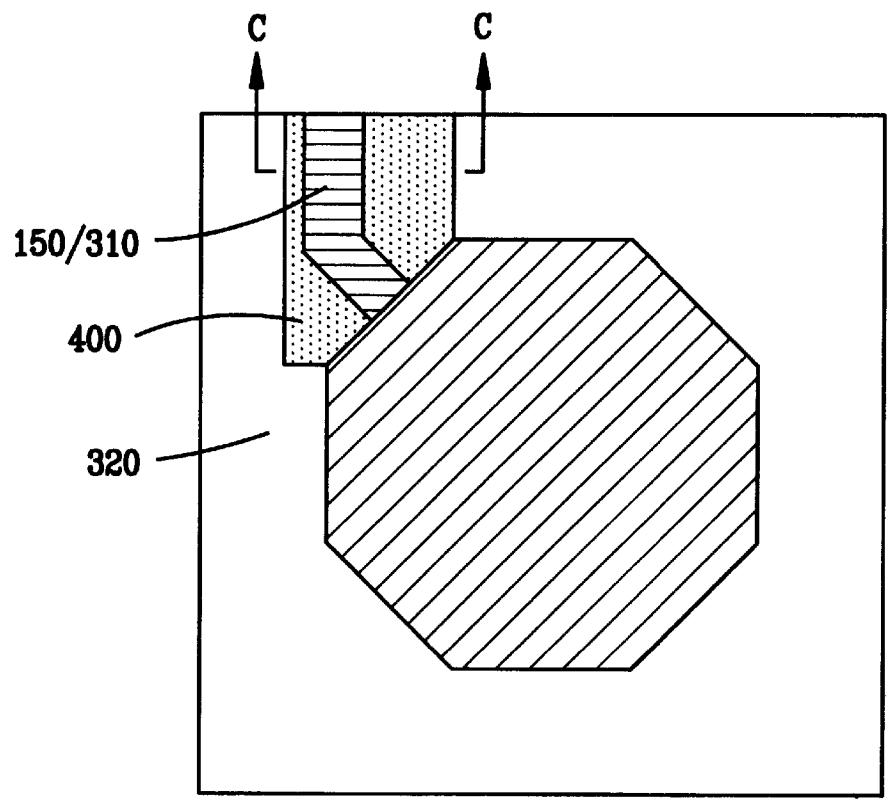
FIG. 5 and FIG. 6 show a specific example of the present invention.
Figure 6:
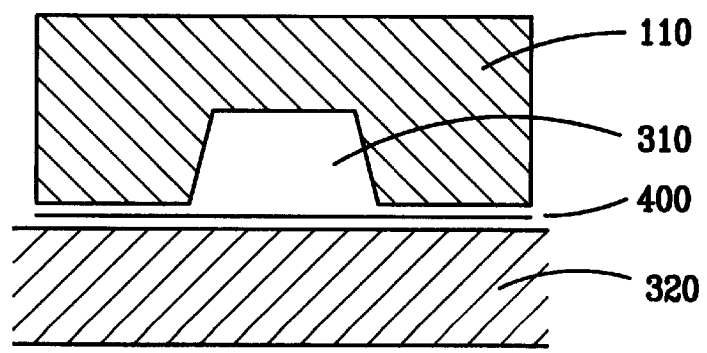

FIG. 5 and FIG. 6 molds used in a specific example of the present invention, wherein the definitions of 110, 150, 310, 320, and 330 are the same as before, and 400 indicates the degate shim. FIG. 6 shows a cross sectional view in the of vertical direction along C—C line in FIG. 5. From said figure, it can be clearly found that degate shim 400 separates encapsulant from substrate 320 completely (no contact).

The encapsulating method of the present invention can not only easily peel off waste material on the gate from press molding product, but also damage of substrate, package and/or electronic device can be avoided. Furthermore, this method does not preset any degate region, so that the problem in line design induced by presetting degating region such as in the U.S. Pat. No. 5,635,671 will not happen. As the present invention need not gold-plating or palladium plating, its cost and requirements on quality control/guarantee can be saved, too. Besides, the present method can avoid the above mentioned defect on breakdown of solder resist or warpage of substrate.

What is claimed is:

1. In a method of encapsulating a substrate-based electronic device which comprises placing the device in an encapsulating mold, said mold including a cavity, a runner, a gate and a pot; supplying an encapsulant to the pot, liquidizing the encapsulant in the pot and causing the liquidized encapsulant to flow into the cavity through the runner and gate to fill the cavity containing the semiconductor device to cause encapsulation, allowing the encapsulant to substantially solidify, opening said mold and removing the encapsulated substrate-based electronic device, wherein the improvement comprises placing a degate shim on the substrate of said substrate-based electronic device located at the position where the runner passes through in order to allow the degate shim to allow substantially no contact of the encapsulant with the substrate during injection of the encapsulant, wherein said degate shim is a mold heat-resisting piece shaped matter, larger than the range of said runner located on said substrate and completely covers said range, and wherein the thickness of said degate shim does not exceed 0.05 mm.

2. The encapsulating method according to 1, wherein said degate shim does not warp during the encapsulant injection process.

3. The encapsulating method according to claim 1, wherein said degate shim is a polymer, an alloy piece, or a metal piece.

\* \* \* \* \*